US007888808B2

(12) United States Patent
Suzuki et al.

(10) Patent No.: US 7,888,808 B2
(45) Date of Patent: Feb. 15, 2011

(54) SYSTEM IN PACKAGE INTEGRATING A PLURALITY OF SEMICONDUCTOR CHIPS

(75) Inventors: Katsunobu Suzuki, Kanagawa (JP); Junichi Iwasaki, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 124 days.

(21) Appl. No.: 11/730,253

(22) Filed: Mar. 30, 2007

(65) Prior Publication Data
US 2008/0151484 A1 Jun. 26, 2008

(30) Foreign Application Priority Data
Dec. 22, 2006 (JP) ............................. 2006-345714

(51) Int. Cl.
H01L 23/48 (2006.01)
H01L 23/52 (2006.01)
H01L 29/40 (2006.01)
(52) U.S. Cl. ................... 257/786; 257/678; 257/685; 257/686; 257/691; 257/723; 257/777; 257/778; 257/E23.02; 257/E23.151; 257/E23.157; 361/777
(58) Field of Classification Search ............... 257/678, 257/777, 686, 685, 723, 786, E23.02, E23.157, 257/E23.151, 778; 361/777
See application file for complete search history.

(56) References Cited

U.S. PATENT DOCUMENTS

| 5,451,814 | A | * | 9/1995 | Yoshimizu | ................. | 257/685 |
| 5,789,816 | A | * | 8/1998 | Wu | ............................. | 257/723 |
| 6,159,765 | A | * | 12/2000 | Drehobl et al. | ............. | 438/106 |
| 6,617,693 | B2 | | 9/2003 | Hikita et al. | | |
| 6,838,766 | B2 | * | 1/2005 | Inoue et al. | ................. | 257/724 |
| 7,091,598 | B2 | * | 8/2006 | Fujita et al. | ................. | 257/691 |
| 2005/0252978 | A1 | * | 11/2005 | Nishizawa et al. | .......... | 235/492 |
| 2006/0197209 | A1 | * | 9/2006 | Choi et al. | ................... | 257/686 |
| 2006/0244130 | A1 | * | 11/2006 | Yeh | ............................. | 257/723 |

FOREIGN PATENT DOCUMENTS

JP 60-044248 3/1985

(Continued)

OTHER PUBLICATIONS

Japanese Patent Office issued a Japanese Office Action dated Apr. 7, 2009, Application No. 2006-345714.

*Primary Examiner*—Matthew E Warren
*Assistant Examiner*—David Z Chen
(74) *Attorney, Agent, or Firm*—Young & Thompson

(57) ABSTRACT

A system in package integrating a plurality of semiconductor chips, including a first chip mounted commonly in a plurality of system in packages and at least including a CPU, a second chip having a different specification for each of the plurality of system in packages depending on a connection of internal lines, and a module substrate including the first chip and the second chip adjacent to each other and having a shape common to the plurality of system in packages. The first chip includes a first module connection terminal on the first chip along a first side facing the second chip or in an area different from the first chip and facing the second chip. A second side of the second chip includes a second module connection terminal to be connected with the first chip. The first and the second module connection terminals are connected by a bonding wire.

7 Claims, 13 Drawing Sheets

FOREIGN PATENT DOCUMENTS

| | | |
|---|---|---|
| JP | 61-162056 | 10/1986 |
| JP | 08-288453 | 11/1996 |
| JP | 8-288453 | 11/1996 |
| JP | 10-111864 | 4/1998 |
| JP | 2000-223657 | 8/2000 |
| WO | WO 02/057921 | 7/2002 |

* cited by examiner

SYSTEM IN PACKAGE INTEGRATING A PLURALITY OF SEMICONDUCTOR CHIPS

BACKGROUND OF THE INVENTION

1. Field of the Invention

The present invention relates to a system in package and particularly to a system in package that integrates a chip including a Central Processing Unit (CPU) used in common for a plurality of products and a custom chip including a different wiring layer for each user to implement different specifications into one package.

2. Description of Related Art

Recent semiconductor apparatus integrate the maximum number of functional blocks constituting a system in order to implement many functions with a small mounting area. One of such semiconductor apparatus is a System on Chip (SoC) in which a plurality of functional blocks are formed on a single semiconductor chip. A SoC implements all functional blocks in one semiconductor process. However, some kind of functional blocks cannot be implemented by the process or have low efficiency in manufacturing the process. For example, if a chip size is too large due to the need for mounting a high-capacity memory or the like, the percentage of non-defective items decreases significantly to fail to manufacture a semiconductor chip. Further, to implement both of a function to be used in common by a plurality of users (which is referred to hereinafter as a common function) and a function with different specifications for each user (which is referred to hereinafter as an individual function) it is necessary for a SoC to design and manufacture a semiconductor chip for each user in any case. Thus, the use of a SoC tales a long development period and requires a high development cost.

In order to overcome such drawbacks, a System in Package (SiP) approach is applied for semiconductor apparatus. The SiP integrates a plurality of semiconductor chips, which form a system, into one package. With the use of a SiP, for example, it is possible to implement a common function on one semiconductor chip (which is referred to hereinafter as a common chip) using a most-advanced fine process while implementing an individual function for each user on a semiconductor chip (hereinafter as an individual chip) that is different from the common chip using a previous generation process. It is also possible to design and manufacture a common chip in advance and then design and manufacture an individual chip only later according to the specifications of a user, which enables reduction of a development period and a development cost. Further, because a SiP allows connection of different chips, a limitation on chip size is significantly less than a SoC. A module that integrates a plurality of semiconductor chips, regardless of their functions, is sometimes called a Multi Chip Module (MCM).

Examples of a SiP are disclosed in Japanese Unexamined Patent Application Publication Nos. 10-111864 (related art 1) and 2000-223657 (related art 2). The semiconductor apparatus described in the related arts 1 and 2 are a SiP or a MCM with the lamination of a main chip of the largest size and a sub chip of the smaller size placed on top of the main chip. In the semiconductor apparatus, the sub chip has a connection terminal of a Ball Grid Array (BGA) type on its bottom surface. The main chip includes a pad on its top surface at the position corresponding to the connection terminal of the sub chip. The sub chip is mounted on the main chip to thereby integrate them into one package. The semiconductor apparatus that packages semiconductor chips in a laminated structure is called a Chip on Chip (CoC).

Another example of a SiP is disclosed in Japanese Domestic Re-publication of PCT Publication No. WO2002/57921 (related art 3). The semiconductor apparatus of the related art 3 is a MCM for detecting a defect at an early stage during the development of a SoC. In the MCM, a plurality of semiconductor chips for implementing the functions to be packaged in a SoC are mounted on a build-up substrate. Particularly, a Field Programmable Gate Array (FPGA) that allows a logic circuit to be programmable is mounted on the build-up substrate. It is thereby possible to implement an individual function for each user and check a defect at an early stage. Further, in order to achieve the high speed communication and highly accurate reproduction in a SoC, it is necessary to integrate the semiconductor chips on the build-up substrate (which is referred to hereinafter as a module substrate) with high density. For the high-density integration, the related art 3 integrates a semiconductor chip in Chip Size Package (CSP) having terminals of the BGA type with face-down positioning, thereby reducing a space between adjacent semiconductor chips.

However, according to the related arts 1 and 2, in the event of a change in the position of the sub chip terminal or in the size of the sub chip, it is necessary to redesign the main chip so as to change the position of pads of the main chip. According to the related art 3, in the event of a change in a semiconductor chip to be mounted on the module substrate, it is necessary to redesign the module substrate according to the modified structure of the semiconductor chip in order to accurately reproduce the characteristics of a SoC. The redesign leads to a longer development period and a higher development cost.

SUMMARY OF THE INVENTION

According to one aspect of the present invention, there is provided a system in package integrating a plurality of semiconductor chips, including a first chip mounted commonly in a plurality of system in packages and at least including a central processing unit, a second chip having a different specification for each of the plurality of system in packages depending on a connection of internal lines, and a module substrate including the first chip and the second chip adjacent to each other and having a shape common to the plurality of system in packages, wherein the first chip includes a first module connection terminal on the first chip along a first side facing the second chip or in an area different from the first chip and facing the second chip, the second chip includes a second module connection terminal to be connected with the first chip on the second chip along a second side facing the first chip, and the first module connection terminal and the second module connection terminal are connected by a bonding wire.

In the system in package of the present invention, the first chip and the second chip are placed on the module substrate having a shape common to a plurality of system in packages and connected by a bonding wire. The second chip can implement an individual function by changing the configuration of a wiring layer. Therefore, the system in package of the present invention enables the design and manufacturing of a customized product that has an individual function in addition to a common function in a short period of time. Further, because the first chip and the second chip are connected by the bonding wire, it eliminates the need for a complicated process such as solder reflowing to mount the second chip. The two chips can be thus connected in a simple process, which shortens a time required for the manufacturing process.

The use of the System in Package according to the present invention enables the provision of a semiconductor apparatus that adds the functions different for each user to the advanced functions used in common in a short period of time with a low development cost.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
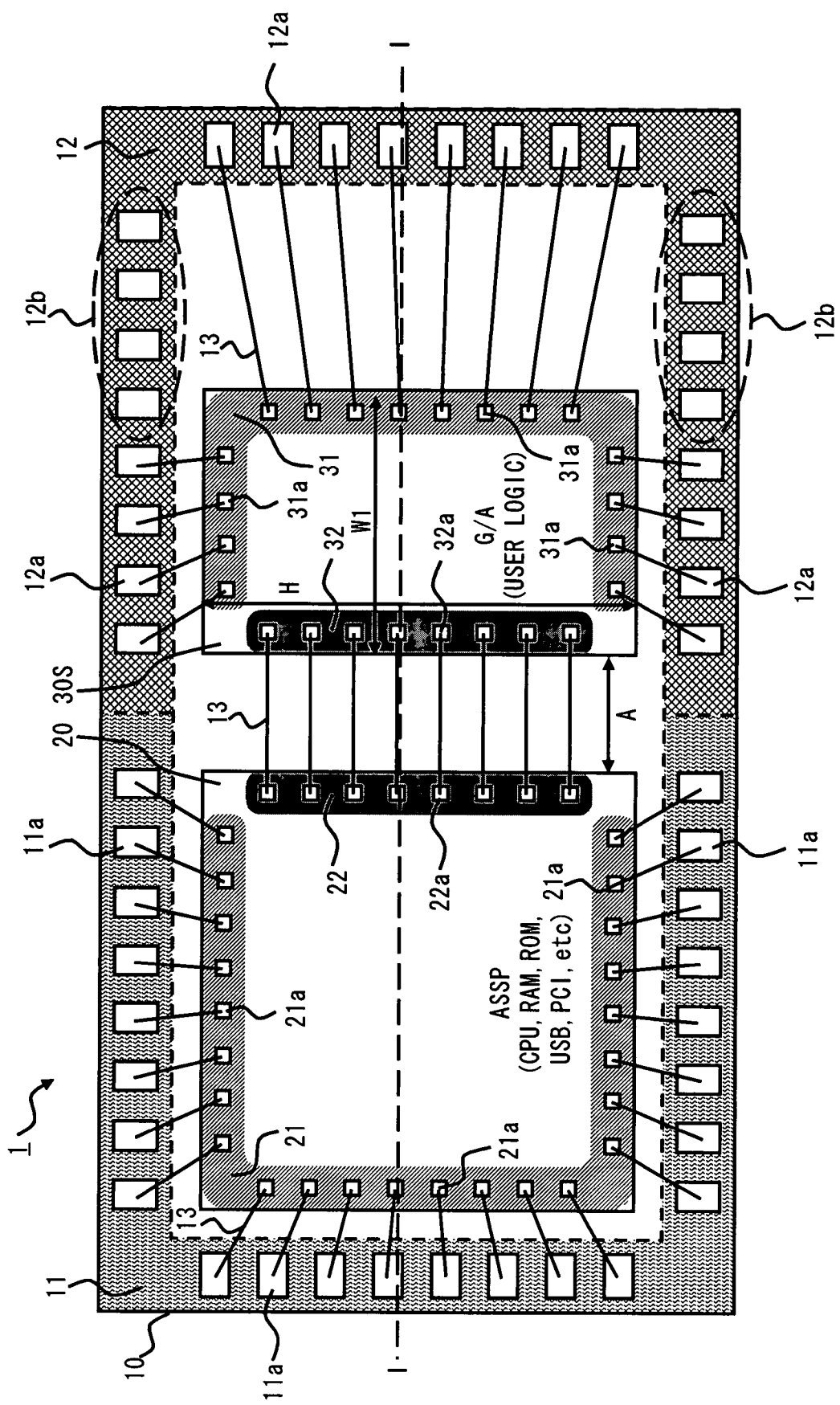
FIG. 1 is a plan view of a SiP according to a first embodiment of the present invention.

Exemplary embodiments of the present invention are described hereinafter with reference to the drawings. In the following description, not every one of a group of elements such as pads and bonding wires is denoted by a reference numeral for simplification of the drawings. The elements having the same shape located in the same area as the element denoted by a reference numeral are the same as the denoted element. FIG. 1 is a plan view of a semiconductor apparatus according to a first embodiment of the present invention. The semiconductor apparatus of this embodiment is a System in Package (which is referred to hereinafter simply as a SiP) that integrates a system including a CPU into one package. As shown in FIG. 1, a SiP 1 of this embodiment includes a module substrate 10, a first chip (e.g. Application Specific Standard Product (ASSP)) 20, a second chip (e.g. Gate Array (G/A)) 30S, for example.

The module substrate 10 includes module pads 11a, 12a and 12b in its periphery. The ASSP 20 and the G/A 30S are arranged adjacent to each other in the area surrounded by the module pads 11a, 12a and 12b. A plurality of module pads 11a are placed in a common pad placement area 11 that is located in the periphery of the module substrate 10 so as to surround the three sides of the area where the ASSP 20 is placed. A plurality of module pads 12a and 12b are placed in an individual pad placement area 12 that is located in the periphery of the module substrate 10 so as to surround the three sides of the area where the G/A 30S is placed. The module pads 12a and 12b are substantially the same and are denoted by different reference numerals merely for distinguishing whether they are connected with a chip pad on the G/A 30S. The module pads 12a are connected with chip pads, which are described later, and the module pads 12b are not connected with the chip pads. The module pads 11a, 12a and 12b are electrically connected with package terminals that are formed on the bottom surface of the module substrate 10. The package terminals are described in detail later.

The ASSP 20 is a semiconductor apparatus that integrates the common functions used by a plurality of users and are shared by a plurality of SiPs. The ASSP 20 may have a circuit to implement the peripheral functions of a CPU, such as a PCI controller, a USB controller and a DAC, in addition to a CPU, a ROM and a RAM, for example. The ASSP 20 has chip pads 21a and first module connection terminals 22a in its periphery.

The chip pads 21a are formed in an external interface placement area 21 that is defined by the three sides that do not face the G/A 30S. The first module connection terminals 22a are formed in an internal interface placement area 22 that is defined by a first side that faces the G/A 30S. The chip pads 21a are connected with the module pads 11a by bonding wires 13 to establish electrical connection with the outside of the module substrate 10. The first module connection terminals 22a are connected with the G/A 30S by bonding wires 13.

The G/A 30S is a circuit to implement an individual function that is different from user to user and has a different circuit configuration and chip size for each user to which the SiP 1 is to be supplied. Although the chip size is described in detail later, the different sizes of G/A can be prepared by changing the length of a third side, which is referred to hereinafter simply as the lateral width, that is orthogonal to a second side of the G/A 30S that faces the ASSP 20. In this embodiment, a gate array that implements a desired function by the design of a wiring layer only is used as the second chip. However, the second chip may be any other semiconductor apparatus as long as it is a semifinished chip with a completed transistor, which allows a wiring part to be formed separately. For the second chip, an embedded array that includes a plurality of completed logic gates and a small number of completed functional blocks, the combination of which is to be changed by a wiring layer, or a standard cell that includes functional blocks with completed internal wiring, which can implement a desired function through a change of the wiring between the functional blocks may be used.

The G/A 30S includes chip pads 31a and second module connection terminals 32a in its periphery. The chip pads 31a are formed in an external interface placement area 31 that is defined by the three sides that do not face the ASSP 20. The second module connection terminals 32a are formed in an internal interface placement area 32 that is defined by the second side that faces the ASSP 20. The chip pads 31a are connected with the module pads 12a by bonding wires 13 to establish electrical connection with the outside of the module substrate 10. The second module connection terminals 32a are connected with the first module connection terminals 22a of the ASSP 20 by bonding wires 13. The ASSP 20 and the G/A 30S are arranged such that the first side of the ASSP 20 and the second side of the G/A 30S are away from each other at a prescribed distance A.

Figure 2:
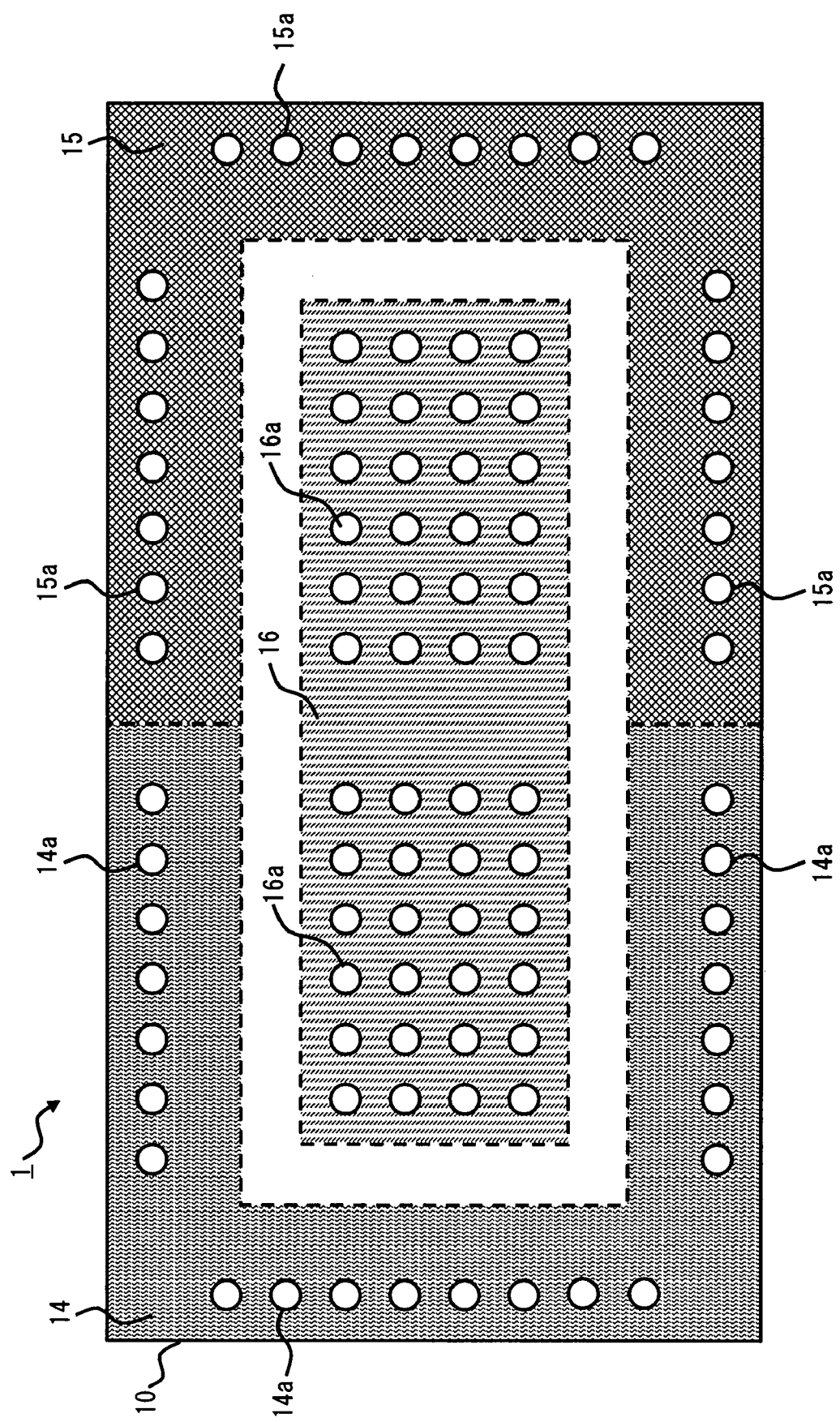
FIG. 2 is a bottom view of the SiP according to the first embodiment of the present invention.

The module terminals that are placed on the bottom surface of the module substrate 10 are described hereinafter. FIG. 2 is a bottom view of the module substrate 10. As shown in FIG. 2, a common specification terminal placement area 14, an individual specification terminal placement area 15, and a free terminal placement area 16 are defined on the bottom surface of the module substrate 10.

First module terminals 14a are placed in the common specification terminal placement area 14. The functions and the arrangement of the first module terminals 14a are the same among different SiPs. The first module terminals 14a are connected with the module pads 11a that are formed on the top surface by a line that is formed inside the module substrate. The functions of the first module terminals 14a are determined by the functions of the ASSP 20 and the terminal arrangement of the chip pads 21a.

Second module terminals 15a are placed in the individual specification terminal placement area 15. The functions and the arrangement of the second module terminals 15a differ according to the type of SiPs. The second module terminals 15a are connected with the module pads 12a and 12b that are formed on the top surface by a line that is formed inside the module substrate. The functions of the second module terminals 15a are determined by the functions of the G/A 30S and the terminal arrangement of the chip pads 31a. Those of the second module terminals 15a which are connected with the module pads 12b are open or grounded.

Third module terminals 16a are placed in the free terminal placement area 16. The third module terminals 16a may be used as heat dissipation terminals of the ASSP 20 and the G/A 30S. In such a case, the third module terminals 16a are connected to the bottom surfaces of the ASSP 20 and the G/A 30S respectively through lines that are formed inside the module substrate. The third module terminals 16a are further connected with a ground plane or a heat dissipation plate, so that they function as dissipation terminals. The third module terminals 16a may be also used as power supply terminals.

Figure 3:
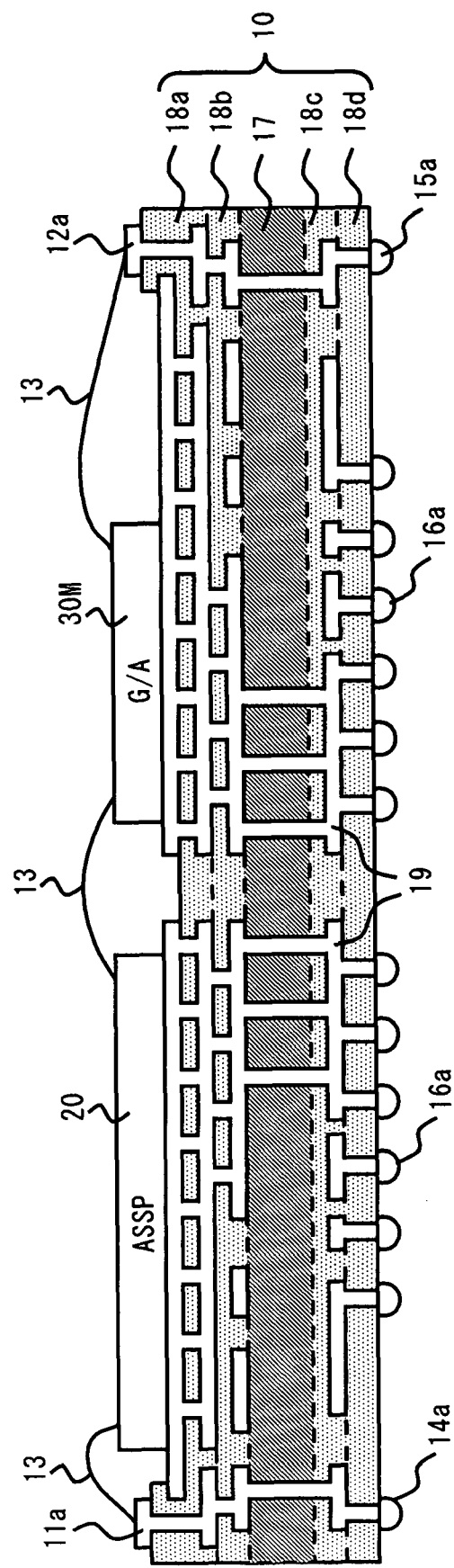
FIG. 3 is a cross-sectional view of the SiP according to the first embodiment of the present invention.

The cross-sectional structure of the SiP 1 is described hereinafter. FIG. 3 shows the cross-section of the SiP 1 along line I-I in FIG. 1. As shown in FIG. 3, the module substrate 10 includes a support substrate 17. A plurality of wiring layers 18a to 18d are formed on the both sides of the support substrate 17. The module pads 11a and 12a are formed on the top surface of the module substrate 10 in the area corresponding to the periphery of the module substrate 10. Further, the ASSP 20 and the G/A 30S are placed at prescribed positions on the module substrate 10, and a ground plane is formed in contact with the under surfaces of the ASSP 20 and the G/A 30S. Interlayer lines are formed in prescribed areas of the wiring layers 18a to 18d of the module substrate 10. The interlayer lines are connected through a via hole (e.g. a blind via hole or a through hole). The via hole is a part of the wiring. The interlayer lines and the via holes constitute inter-substrate lines 19. The inter-substrate lines 19 appropriately connect the module pads 11a, 12a and the ground plane and the module terminals formed on the bottom surface of the module substrate 10. Although not shown, the module substrate 10, the ASSP 20, the G/A 30S and the bonding wires 13 are covered with a molding material such as a resin.

The SiP 1 of this embodiment uses the module substrate 10 and the ASSP 20 having the same specifications in common with a plurality of SiPs to be different products. It further uses a different combination with the G/A 30S according to a product to be produced, thereby achieving different specifications for different products. This eliminates the need for redesigning the module substrate 10 and the ASSP 20 according to a product to be produced, which allows the module substrate 10 and the ASSP 20 to be manufactured prior to the determination of user specifications, enabling quick delivery of a product.

The SiP 1 of this embodiment connects the ASSP 20 and the G/A 30S by the bonding wire 13. The bonding wire connection process can use simpler equipment and takes a shorter time compared with a solder reflow process for mounting a semiconductor apparatus of a BGA package onto a substrate. Thus, connecting the ASSP 20 and the G/A 30S by the bonding wire 13 enables reduction of a manufacturing time.

Figure 4:
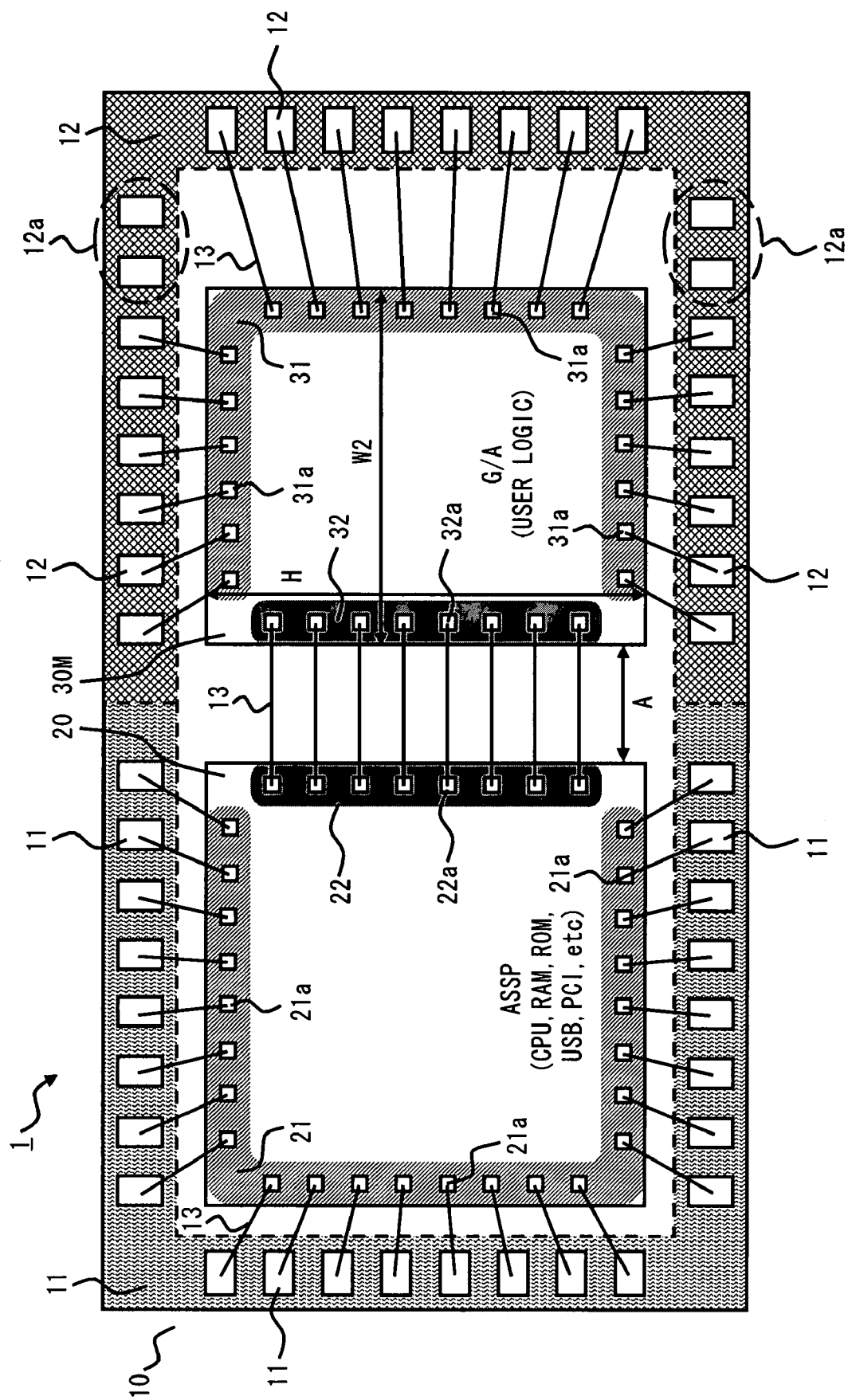
FIG. 4 is a plan view showing an example of mounting a second chip having a different chip size in the SiP according to the first embodiment of the present invention.

The placement of different chip sizes of G/A on the SiP 1 of this embodiment is described hereinafter in detail. FIG. 4 shows the case of mounting a G/A 30M having a larger chip size than the G/A 30S, and FIG. 5 shows the case of mounting a G/A 30L having a still larger chip size than the G/A 30M.

As shown in FIG. 4, the length H of the second side, which is referred to hereinafter simply as the vertical height, of the G/A 30M is the same as the vertical height H of the G/A 30S. The lateral width W2 of the G/A 30M is longer than the lateral width W1 of the G/A 30S.

Figure 5:
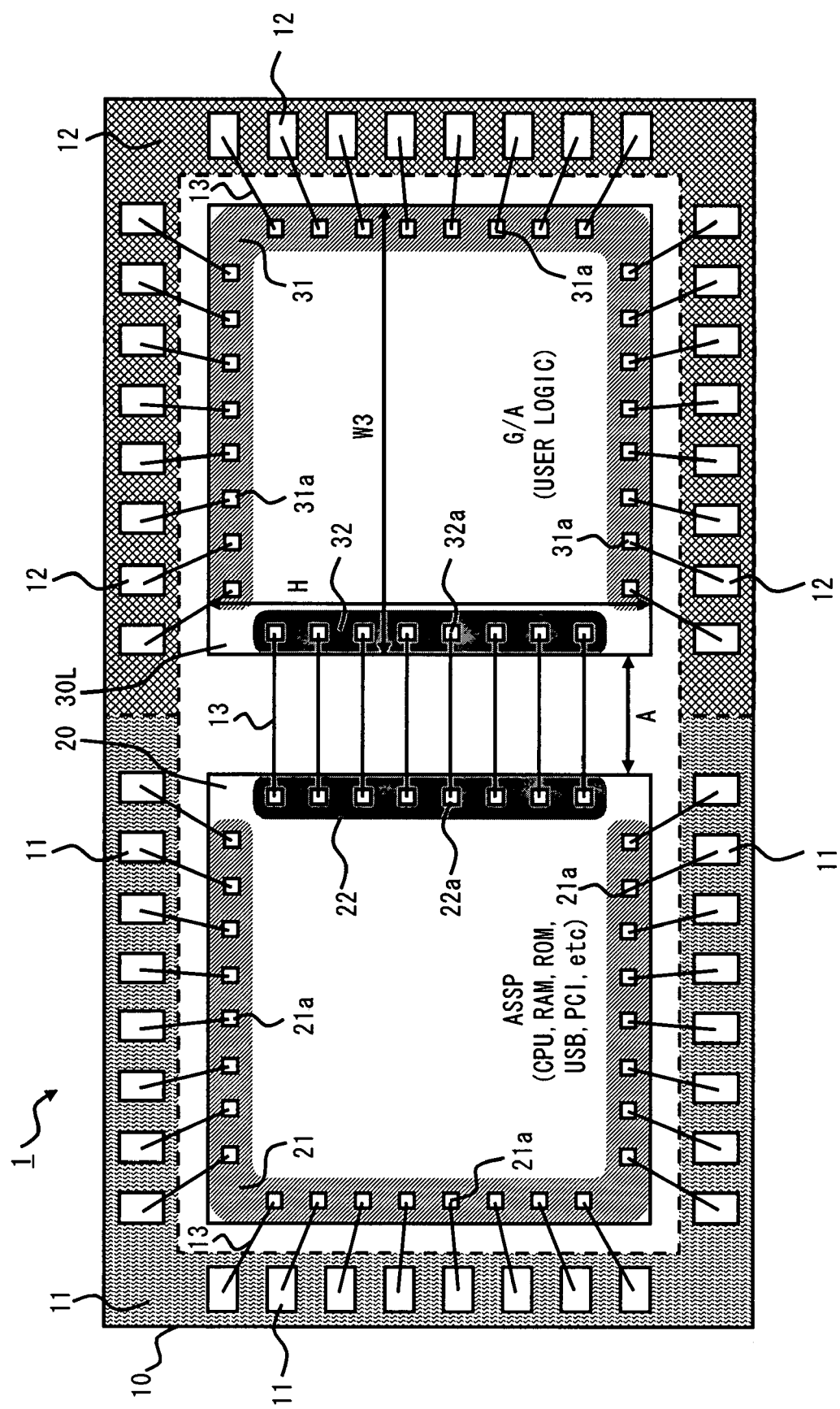
FIG. 5 is a plan view showing another example of mounting a second chip having a different chip size in the SiP according to the first embodiment of the present invention.

As shown in FIG. 5, the vertical height H of the G/A 30L is the same as the vertical height H of the G/A 30S. The lateral width W3 of the G/A 30L is longer than the lateral width W2 of the G/A 30M. The G/A 30M has the same number of the second module connection terminals 32a as those of the G/A 30S along the second side. In the SiP 1 shown in FIGS. 1, 4 and 5, the first side of the ASSP 20 and the second side of each G/A are preferably away from each other at the distance A regardless of the chip size of the G/A. This allows a distance between the first module connection terminals 22a and the second module connection terminals 32a to be constant regardless of the G/A chip size.

In this way, the chip size is adjusted by changing the lateral width while keeping the same vertical height, so that the arrangement of the second module connection terminals 32a along the first side of the G/A is the same. Further, the arrangement of the second module connection terminals 32a among the different sizes of G/A and the distance between the first module connection terminals 22a and the second module connection terminals 32a are respectively the same, so that the bonding conditions to connect the ASSP and the G/A by the bonding wires are the same. This embodiment thereby enables the manufacturing of SiPs having different functions under the same bonding conditions. This permits sharing of the bonding conditions and manufacturing equipment, which simplifies the manufacturing process compared with a SiP of related arts.

Figure 6:
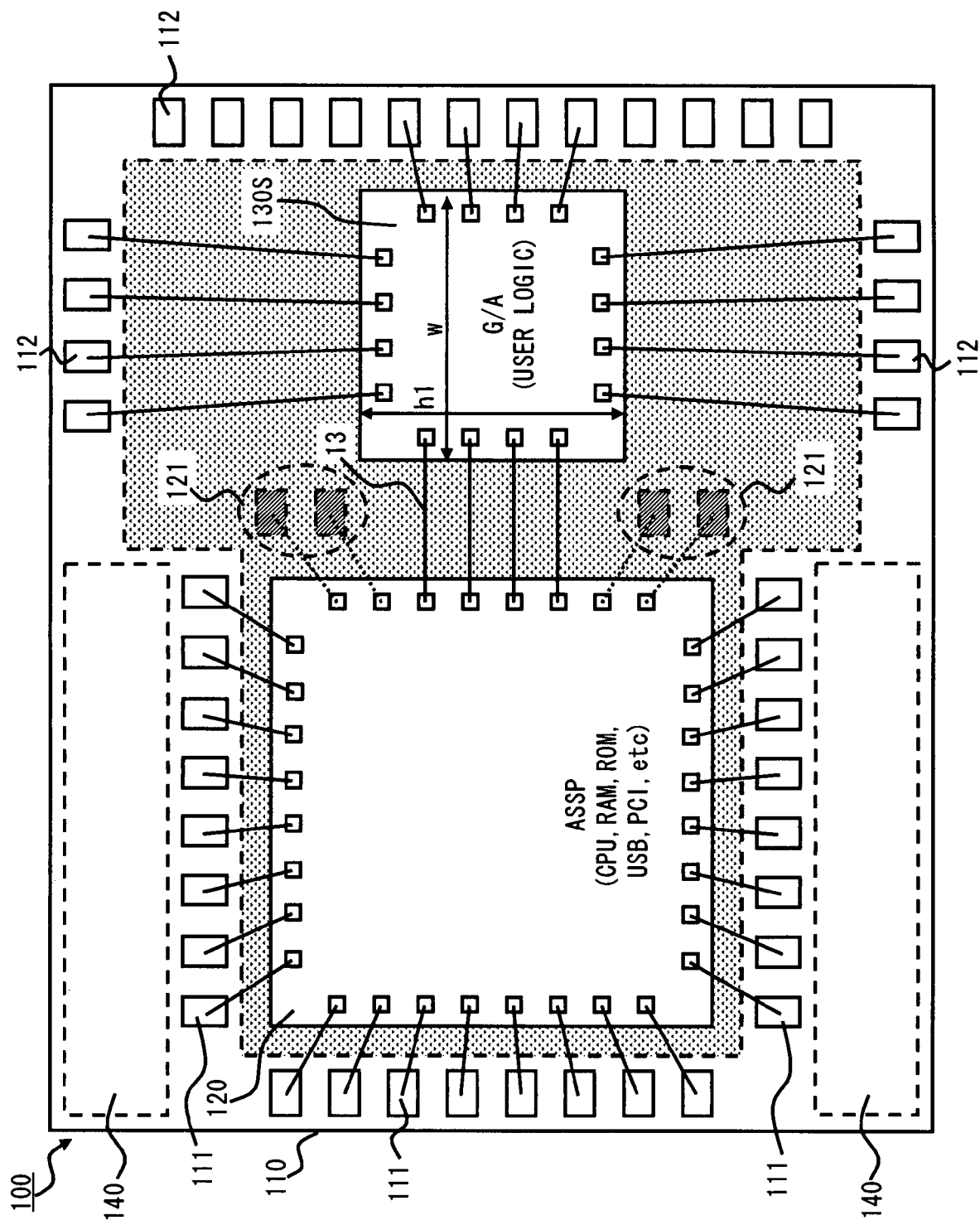
FIG. 6 is a plan view showing a comparative example of the SiP according to the first embodiment of the present invention.
Figure 7:
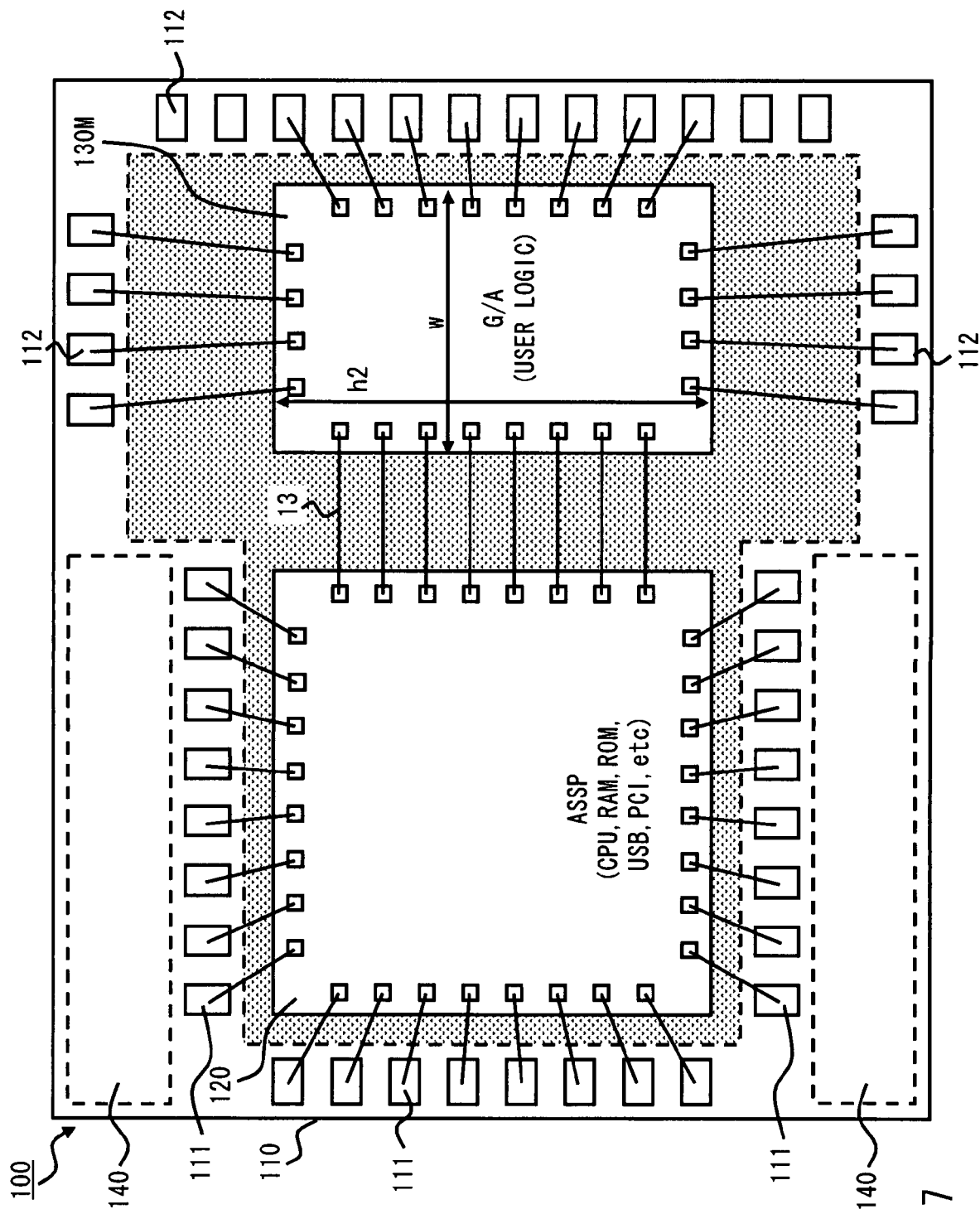
FIG. 7 is a plan view showing a comparative example of the SiP according to the first embodiment of the present invention.
Figure 8:
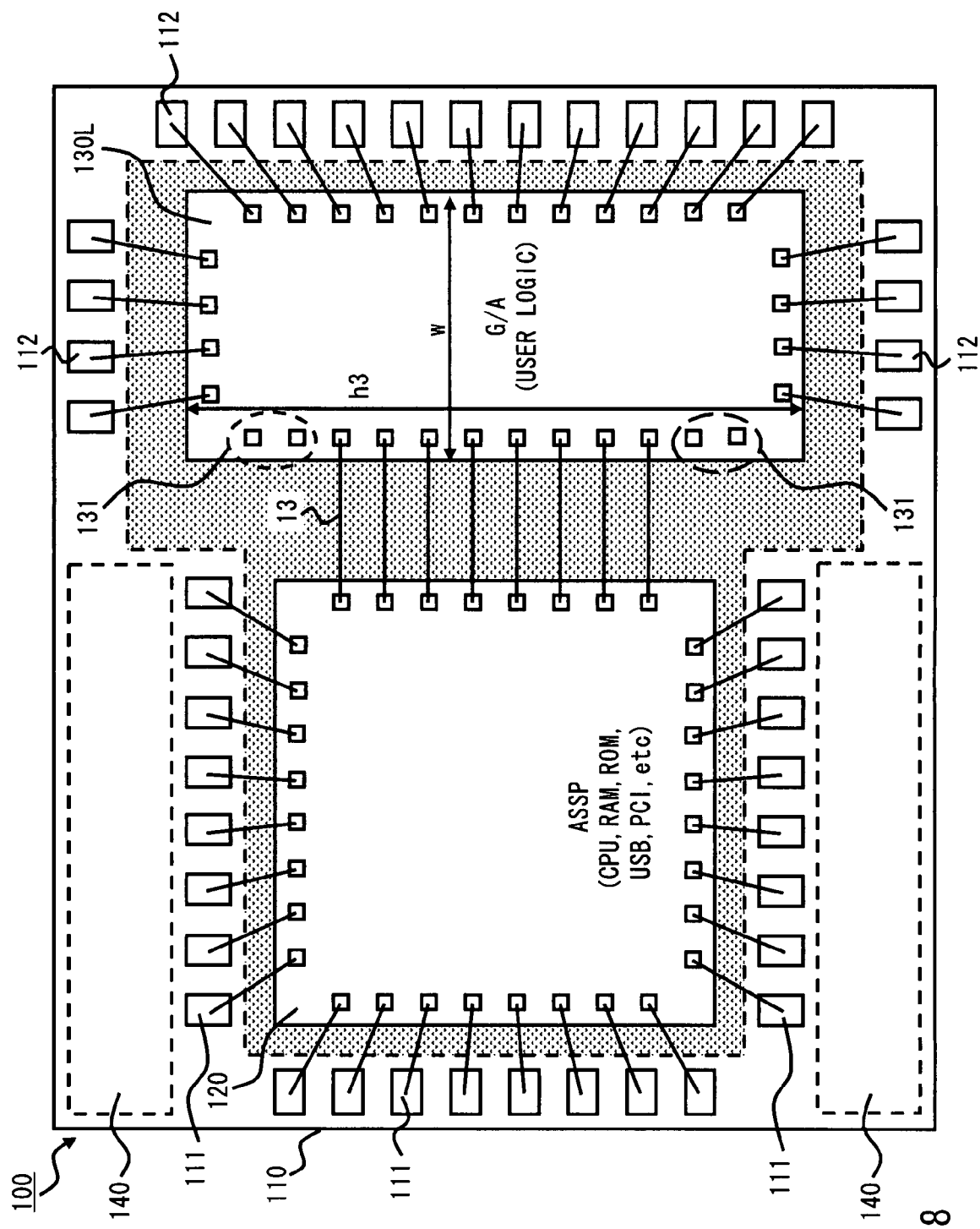
FIG. 8 is a plan view showing a comparative example of the SiP according to the first embodiment of the present invention.

As comparative examples, SiPs in which the chip size of a G/A is changed by way of changing the vertical height of the G/A are described hereinafter. FIGS. 6 to 8 show the plan views of exemplary SiPs 100 on which G/As with different vertical heights can be mounted. The SiPs 100 shown in FIGS. 6 to 8 include the ASSP 120 of the same chip size. The SiPs 100 also include a G/A 130S, a G/A 130M and a G/A 130L with the vertical heights of h1<h2<h3, respectively.

In the example of FIG. 6, the vertical height h1 of the G/A 130S is shorter than the length of the first side of the ASSP 120. Thus, some of the first module connection terminals that are located along the first side of the ASSP 120 cannot be connected with the G/A. In order to connect these terminals, it is necessary to add bonding pads 121 on the module substrate 110, for example. The use of such a small size of G/A may hinder the use of the module substrate 110 in common with other products.

In the example of FIG. 7, the vertical height h2 of the G/A 130M is the same as the length of the first side of the ASSP 120, which allows the use of the module substrate 100 without any change. In the example of FIG. 8, the vertical height h3 of the G/A 130L is longer than the length of the first side of the ASSP 120. Thus, second module connection terminals 131 that cannot be connected directly with the ASSP 120 exist in the G/A 130L. In order to connect these terminals, it is necessary to add bonding pads separately.

In the above comparative examples where the vertical height of a G/A differs for each product, it is sometimes impossible to place a bonding wire to connect the ASSP and the G/A on either of them depending on the chip size of the G/A.

Further, in order to share the module substrate 110 among the SiPs 100 in the above comparative examples, a dead space 140 is required above and below the ASSP 120. Although the dead space 140 is always necessary regardless of the chip size of the G/A, it is a useless area that is not particularly utilized. Due to the dead space 140 of the SiP 100, the module substrate 110 has a uselessly large size, which increases the cost of the module substrate.

On the other hand, in the SiP 1 of this embodiment, the vertical height of a G/A is constant regardless of the chip size, thus not requiring a useless space above and below the ASSP 20. The SiP 1 of this embodiment can thus use a module substrate of a smaller size than that of the comparative examples. It also eliminates the possibility that an unconnected terminal for which a bonding wire cannot be placed exists.

Second Embodiment

Figure 9:
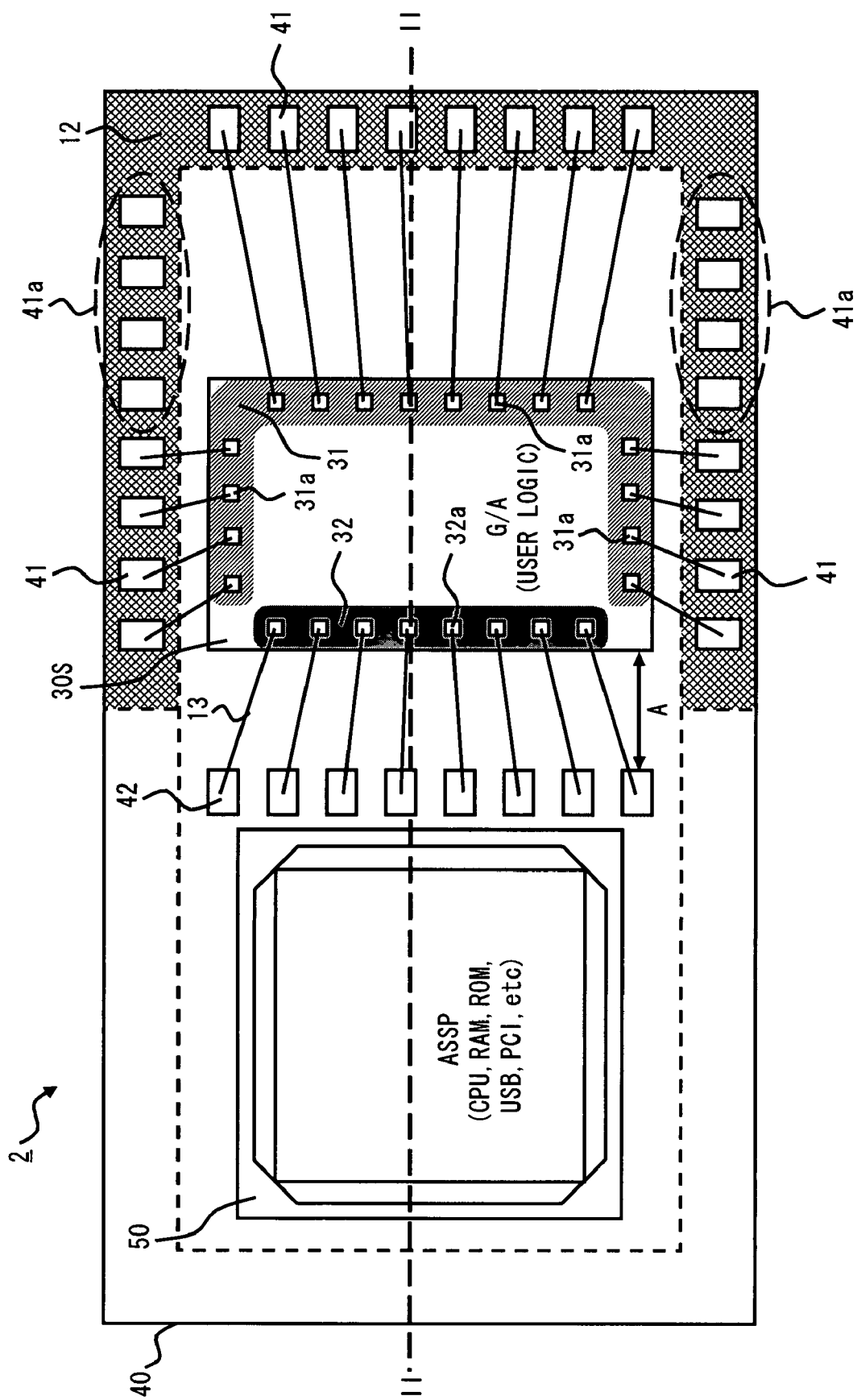
FIG. 9 is a plan view of a SiP according to a second embodiment of the present invention.

A SiP 2 according to a second embodiment of the present invention is such that an ASSP that is used in common among different SiPs 2 is a semiconductor apparatus of a BGA type. FIG. 9 shows a plan view of the SiP 2. As shown in FIG. 9, in the SiP 2, an ASSP 50, which is a semiconductor apparatus that is equivalent to the ASSP 20 of the first embodiment, is mounted on a module substrate 40. On the module substrate 40, first module connection terminals 42 are placed along the side of the ASSP 50 that faces the G/A 30S. The first module connection terminals 42 are connected with prescribed terminals of the ASSP 50 by inter-substrate lines of wiring layers formed inside the module substrate. In the second embodiment also, the second module connection terminals 32a of the G/A 30S are connected with the first module connection terminals 42 by the bonding wires 13.

Figure 10:
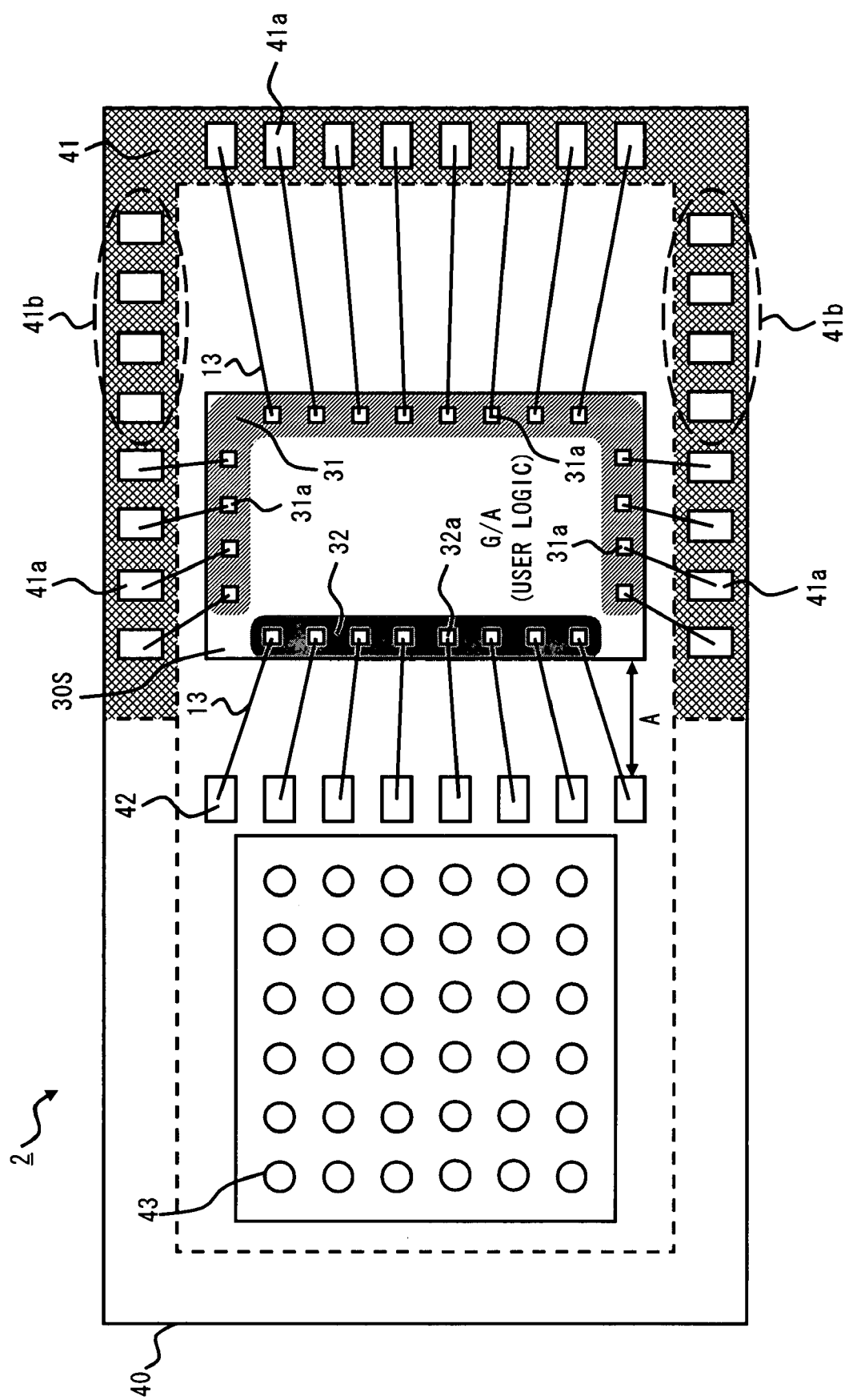
FIG. 10 is a plan view where an ASSP is removed from the SiP according to the second embodiment of the present invention.
Figure 11:
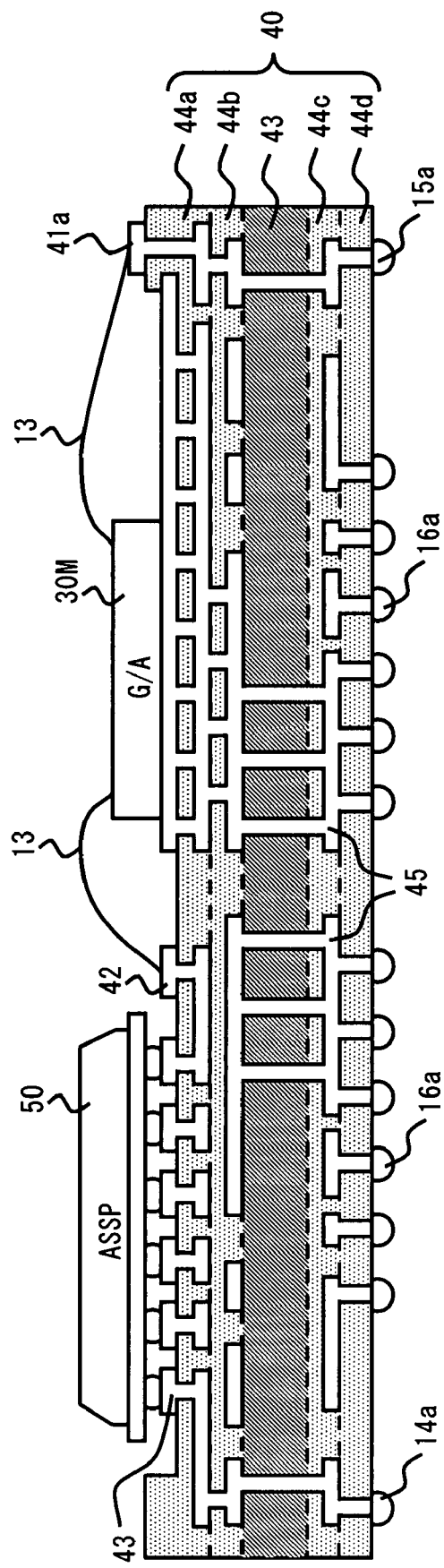
FIG. 11 is a cross-sectional view of the SiP according to the second embodiment of the present invention.

FIG. 10 shows a plan view where the ASSP 50 is removed from the module substrate 40 of the SiP 2. As shown in FIG. 10, in the area of the module substrate 40 where the ASSP 50 is to be placed, connection terminals 43 to be connected with terminals of the ASSP 50 are formed in the positions corresponding to the terminals of the ASSP 50. FIG. 11 shows the cross-section of the SiP 2 along line II-II in FIG. 9. As shown in FIG. 11, the connection terminals 43 are connected with the first module connection terminals 42 or module terminals 14a, 15a and 16a that are formed on the bottom surface of the module substrate 40 by inter-substrate lines that are formed in wiring layers 44a to 44d.

As described above, the SiP 2 also allows the second module connection terminals 32a and the first module connection terminals 42 to be connected by the bonding wire 13 by placing the first module connection terminals 42 on the module substrate 40. It is thus possible to simplify the manufacturing process as in the first embodiment regardless of the mounting method of the ASSP 50. In this embodiment also, the module terminals that are formed on the bottom surface of the module substrate 40 to be connected with the ASSP 50 serve as the first module terminals 14a having common specification among a plurality of SiPs 2, and the module terminals that are formed on the bottom surface of the module substrate 40 to be connected with the G/A 30S serve as the second module terminals 15a having different specifications among a plurality of SiPs 2. A distance between the first module connection terminals 42 and the second module connection terminals 32a of the G/A is substantially constant regardless of the chip size of the G/A.

Third Embodiment

Figure 12:
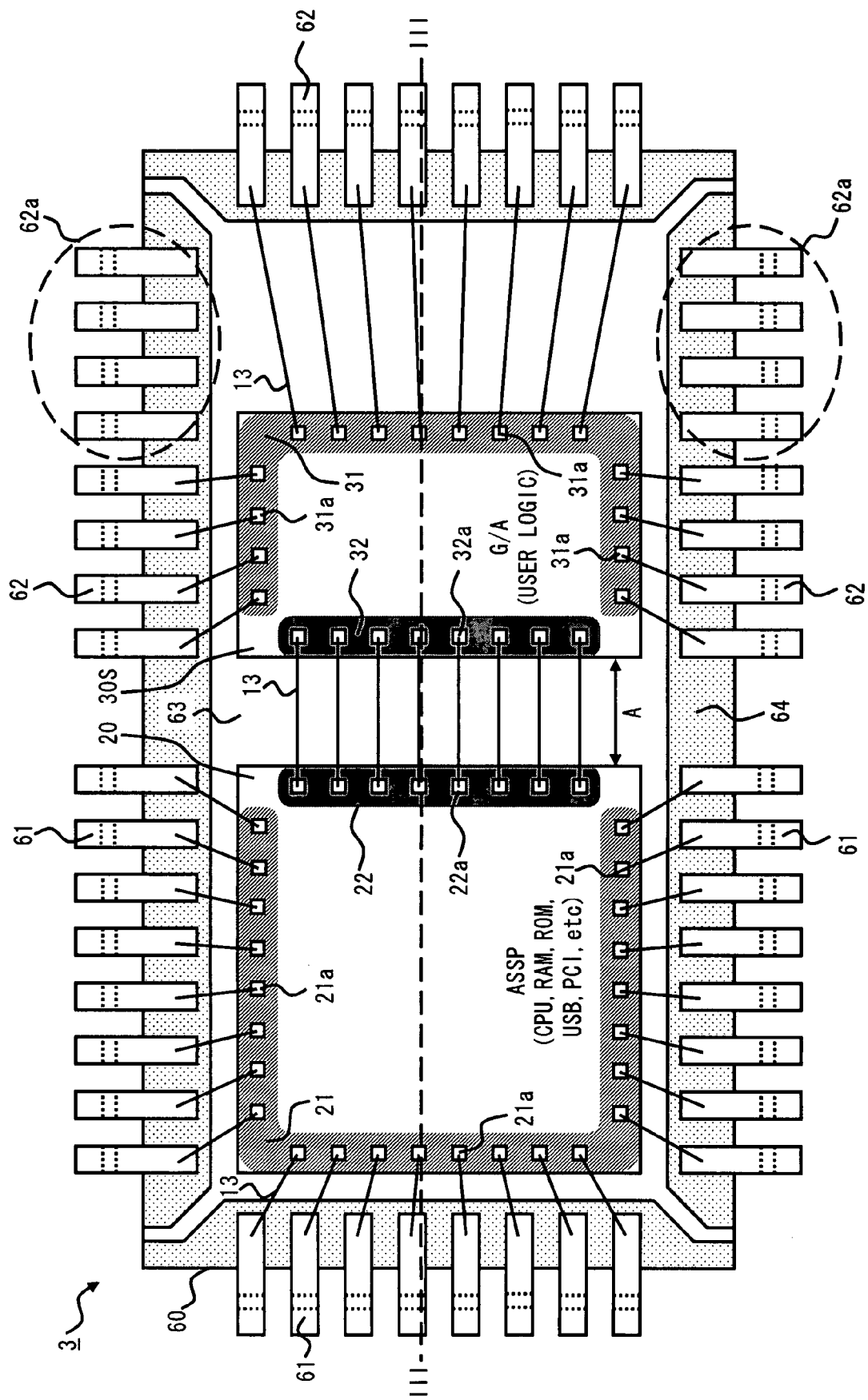
FIG. 12 is a plan view of a SiP according to a third embodiment of the present invention.

The SiP 1 according to the first embodiment includes BGA-type terminals. On the other hand, a SiP 3 according to a third embodiment of the invention includes pin-type terminals. FIG. 12 shows a plan view of the SiP 3. As shown in FIG. 12, the ASSP 20 and the G/A 30S are connected by the bonding wire 13 in the SiP 3 as well. The ASSP 20 and the G/A 30S are mounted on an inner lead 63. Module terminals 61 are placed in the periphery of a lead frame as terminals that are equivalent to the module pads placed in the common pad placement area 11. Further, module terminals 62 and 62a are placed as terminals that are equivalent to the module pads placed in the individual pad placement area 12. The module terminals 61 and 62 are connected with the chip pads 21a of the ASSP 20 and the chip pads 31a of the G/A 30S, respectively, by the bonding wires 13. In the SiP 3, the module terminals 61 correspond to the first module terminals 14a of the first embodiment, and the module terminals 62 correspond to the second module terminals 15a of the first embodiment.

Figure 13:
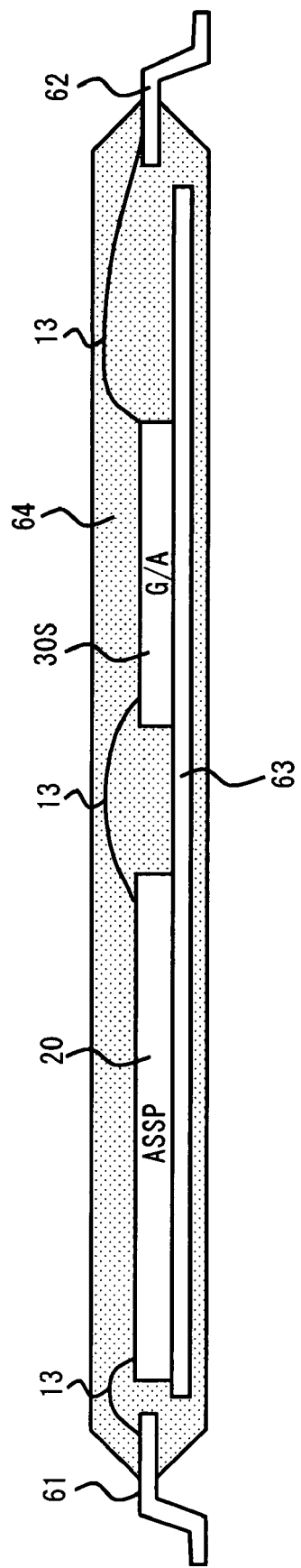
FIG. 13 is a cross-sectional view of the SiP according to the third embodiment of the present invention.

FIG. 13 shows the cross-section of the SiP 3 along line III-III in FIG. 12. As shown in FIG. 13, the SiP 3 is such that a part of the module terminals 61 and 62, the inner lead 63, the ASSP 20, the G/A 30S and the bonding wires 13 are covered with a molding material such as a resin.

The SiP of the present invention can be achieved with the use of a package having pin-type terminals as in the third embodiment.

The present invention is not restricted to the above-mentioned embodiments and various changes may be made without departing from the scope of the invention. For example, although a package and an ASSP may be integrated by different methods as described above, it is not limited to the above embodiments.

It is apparent that the present invention is not limited to the above embodiment that may be modified and changed without departing from the scope and spirit of the invention.

What is claimed is:

1. A system in package integrating a plurality of semiconductor chips, comprising:
 a first chip at least including a central processing unit;
 a second chip having a user specification; and a module substrate including the first chip and the second chip adjacent to each other,
wherein
the first chip includes first module connection terminals on the first chip along a first side facing the second chip,
the second chip includes second module connection terminals to be connected with the first chip, on the second chip along a second side facing the first chip, and includes a third side orthogonal to the second side,
the first module connection terminals on the first chip and the second module connection terminals on the second chip are directly connected to each other by respective bonding wires,
the module substrate includes first module terminals connected to respective connection terminals of the first chip other than the first module connection terminals of the first chip and second module terminals, where first ones of the second module terminals are connected to respective connection terminals of the second chip other than the second module connection terminals of the second chip and second ones of the second module terminals are unused,
the module substrate further includes first-module-side pads electrically connected to respective ones of the first module terminals, second-module-side pads electrically connected to respective first ones of the second module terminals, and third-module-side pads electrically connected to respective second ones of the second module terminals,
the second-module-side pads are directly connected to respective connection terminals of the second chip other than the second module connection terminals of the second chip by a bonding wire, and the third-module-side pads are not connected to the first chip or the second chip, and
the first-module-side pads, the second-module-side pads and the third-module-side pads are on a surface of the module substrate having the first and second chips mounted thereon in a periphery of the module substrate, the first-module-side pads being on three peripheral sides of the first chip other than the first side and the second and third-module-side pads being on three peripheral sides of the second chip other than the second side so that the first, second and third-module-side pads surround the first and second chips, there being no unused pads of any type among the first-module-side pads on the three peripheral sides of the first chip.

2. The system in package of claim 1, wherein the first and second module terminals are connection terminals.

3. The system in package of claim 2, wherein the first and second module terminals are on a bottom surface of the module substrate opposite the surface of the module substrate having the first and second chips mounted thereon.

4. The system in package of claim 3, wherein
the first module terminals are in a first area of the bottom surface, and
the second module terminals are in a second area of the bottom surface different than the first area.

5. The system in package of claim 1, wherein the first chip is connected to the module substrate by a terminal on a bottom of the first chip.

6. The system in package of claim 5, wherein the module substrate includes a wiring layer to which the terminal on the bottom of the first chip is connected, and the first module connection terminal is connected to the first chip through the wiring layer.

7. The system in package of claim 1, wherein the first and second module terminals project from a periphery of a bottom surface of the module substrate.

* * * * *